United States Patent
Aipperspach et al.

(10) Patent No.: US 9,424,389 B2
(45) Date of Patent: Aug. 23, 2016

(54) IMPLEMENTING ENHANCED PERFORMANCE DYNAMIC EVALUATION CIRCUIT BY COMBINING PRECHARGE AND DELAYED KEEPER

(71) Applicant: International Business Machines Corporation, Armonk, NY (US)

(72) Inventors: Anthony G. Aipperspach, Rochester, MN (US); Derick G. Behrends, Rochester, MN (US); Todd A. Christensen, Rochester, MN (US); Jesse D. Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/574,571

(22) Filed: Dec. 18, 2014

(65) Prior Publication Data

US 2016/0180004 A1    Jun. 23, 2016

(51) Int. Cl.
*G06F 17/50* (2006.01)
*G01R 19/165* (2006.01)

(52) U.S. Cl.
CPC ...... *G06F 17/5081* (2013.01); *G01R 19/16519* (2013.01)

(58) Field of Classification Search
CPC .................................................. G06F 17/5068
USPC .......................................................... 716/119
See application file for complete search history.

(56) References Cited

U.S. PATENT DOCUMENTS

| | | | |
|---|---|---|---|
| 6,434,071 B1 | 8/2002 | Labrecque | |
| 6,693,459 B2 | 2/2004 | Nedovic et al. | |
| 7,088,143 B2 | 8/2006 | Ding et al. | |
| 7,109,757 B2 | 9/2006 | Yuan et al. | |
| 7,193,446 B2 | 3/2007 | Ngo et al. | |
| 7,501,850 B1 | 3/2009 | Correale, Jr. et al. | |
| 8,416,002 B2 | 4/2013 | Liu et al. | |
| 8,508,275 B2 | 8/2013 | Sathianthan | |
| 2008/0116938 A1 | 5/2008 | Ngo et al. | |
| 2011/0193609 A1 | 8/2011 | Lin et al. | |
| 2011/0292748 A1 | 12/2011 | Adams et al. | |
| 2012/0266116 A1* | 10/2012 | Ding | H01Q 1/2283 716/101 |

OTHER PUBLICATIONS

Kulkarni, J.P.; et al., "A High Performance, Scalable Multiplexed Keeper Technique", Quality Electronic Design, 2007. ISQED '07. 8th International Symposium on Digital Object Identifier: 10.1109/ISQED.2007.14, Publication Year: 2007, pp. 545-549.
IPCOM000155030D, "Low power dynamic circuit with high noise tolerance" IBM, Jul. 17, 2007.
IPCOM000124552D, "(Leakage #7) Pulse Gated Keeper for Dynamic Logic", IBM, Apr. 27, 2005.
Appendix P—List of IBM Patents or Patent Applications Treated as Related—Apr. 30, 2015.

* cited by examiner

*Primary Examiner* — Suresh Memula
(74) *Attorney, Agent, or Firm* — Joan Pennington

(57) ABSTRACT

A method and circuit for implementing enhanced performance dynamic evaluation, and a design structure on which the subject circuit resides are provided. The dynamic evaluation circuit includes a combined precharge and keeper device connected to a precharge node. The dynamic evaluation circuit includes control logic providing a control input to the combined precharge and keeper device. The combined precharge and keeper device responsive to the control input holds the precharge node precharged when the precharge node is not discharged early in an evaluate cycle.

15 Claims, 8 Drawing Sheets

PRIOR ART

700

Performance Measurements

|  | Delay (ps) EVAL to global_dot | Percentage Improvement |
|---|---|---|
| Prior Art | 45.26 | --- |
| Embodiment#1 | 44.69 | 1.26% |
| Embodiment#2 | 43.83 | 3.16% |

FIG. 7

IMPLEMENTING ENHANCED PERFORMANCE DYNAMIC EVALUATION CIRCUIT BY COMBINING PRECHARGE AND DELAYED KEEPER

FIELD OF THE INVENTION

The present invention relates generally to the data processing field, and more particularly, relates to a method and circuit for implementing enhanced performance dynamic evaluation, and a design structure on which the subject circuit resides.

DESCRIPTION OF THE RELATED ART

A need exists for an efficient and effective circuit for implementing enhanced performance dynamic evaluation.

As technologies advance, performance continues to be a prime driver of circuit design innovation. Single thread performance especially for new processor products continues to be a critical metric for customers. New circuits are needed to continue to drive processor cycle time as fast as possible.

FIG. 1 illustrates an example prior art dynamic evaluation circuit with a delayed keeper. A typical usage example would be a two-port Static Random Access Memory (SRAM) cell in which the evaluation devices include a stacked pair of N-channel field effect transistors (NFETs). A delayed keeper is needed since the SRAM devices are small and cannot reliably overcome a turned on keeper P-channel field effect transistors (PFET). A second stage evaluation circuit is shown with a global dot node to connect or tie together multiple local dot nodes.

FIG. 2 shows typical waveforms for the prior art dynamic evaluation circuit of FIG. 1. The delayed keeper receiving input PC Delay is turned on only after the local dot node would have discharged. If the local dot node discharged then the PC delay signal has no effect. If the local dot node did not discharge then the PC delay signal will turn the local keeper on, thus preventing the local dot node from discharging inadvertently due to leakage. The PC delay signal is timed such that the slowest possible discharge will happen before the delayed keeper turns on and the delayed keeper will turn on before the fastest leakage discharge event could take place.

SUMMARY OF THE INVENTION

Principal aspects of the present invention are to provide a method and circuit for implementing enhanced performance dynamic evaluation, and a design structure on which the subject circuit resides. Other important aspects of the present invention are to provide such method, circuit and design structure substantially without negative effects and that overcome many of the disadvantages of prior art arrangements In brief, a method and circuit for implementing enhanced performance dynamic evaluation, and a design structure on which the subject circuit resides are provided. The dynamic evaluation circuit includes a combined precharge and keeper device connected to a precharge node. The dynamic evaluation circuit includes control logic providing a control input to the combined precharge and keeper device. The combined precharge and keeper device responsive to the control input holds the precharge node precharged when the precharge node is not discharged early in an evaluate cycle.

In accordance with features of the invention, performance of the dynamic evaluation circuit is enhanced by reducing device load from the sensitive precharge node which is the evaluation or local dot node of the dynamic evaluation circuit. Delay through the dynamic evaluation circuit is reduced by the combined precharge and keeper device and the control logic driving the combined precharge and keeper device from downstream nodes that are less affected by extra load.

In accordance with features of the invention, the control logic providing a control gate input to the combined precharge and keeper device includes a 2-input AND gate providing an input to a 2-input NOR gate that receives a precharge signal at its second input. The AND gate receives inputs of a set keeper delay signal and output of an inverter connected to a local evaluation inverter.

BRIEF DESCRIPTION OF THE DRAWINGS

The present invention together with the above and other objects and advantages may best be understood from the following detailed description of the preferred embodiments of the invention illustrated in the drawings, wherein:

FIG. 7 is chart illustrating performance measurements of the example circuits FIGS. 3 and 5 in accordance with a preferred embodiments for comparison with the prior art.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing enhanced performance dynamic evaluation, and a design structure on which the subject circuit resides are provided. The dynamic evaluation circuit includes a combined precharge and keeper device connected to a precharge node. The dynamic evaluation circuit includes control logic providing a control input to the combined precharge and keeper device. The combined precharge and keeper device responsive to the control input holds the precharge node precharged when the precharge node is not discharged early in an evaluate cycle.

Figure 3:
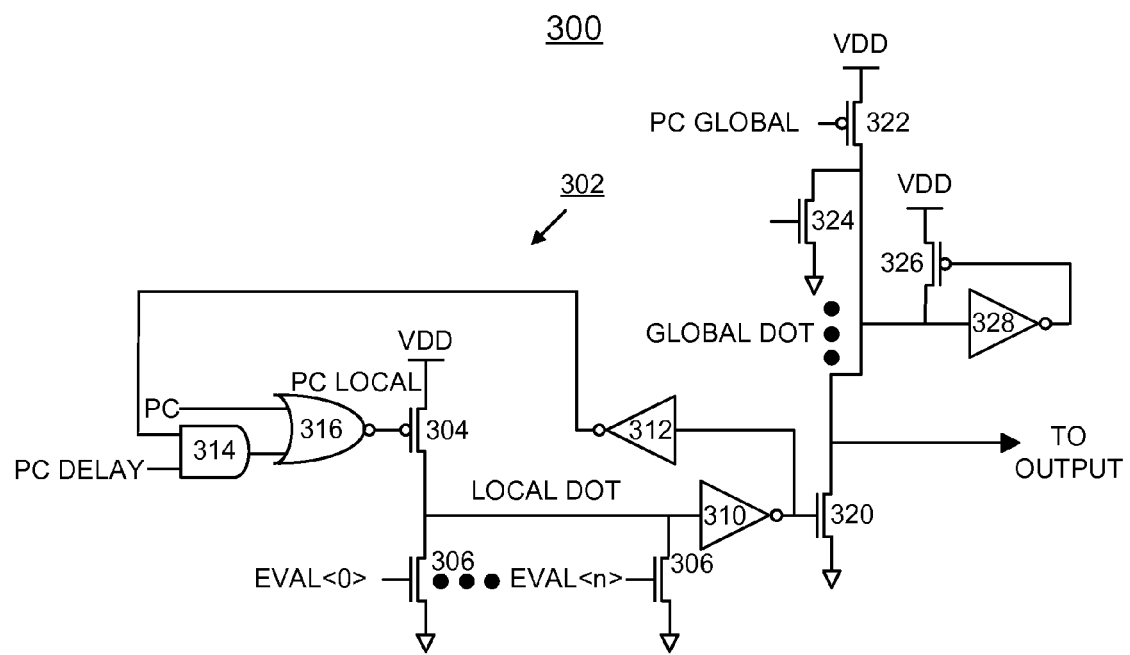
FIG. 3 is a schematic and block diagram representation illustrating an example circuit for implementing enhanced performance dynamic evaluation in accordance with a preferred embodiment.

Having reference now to the drawings, in FIG. 3, there is shown an example circuit for implementing enhanced performance dynamic evaluation generally designated by the reference character 300 in accordance with a preferred embodiment. Circuit 300 provides improvement over prior art circuits, such as circuit 100, improving dynamic evaluation performance.

Figure 1:
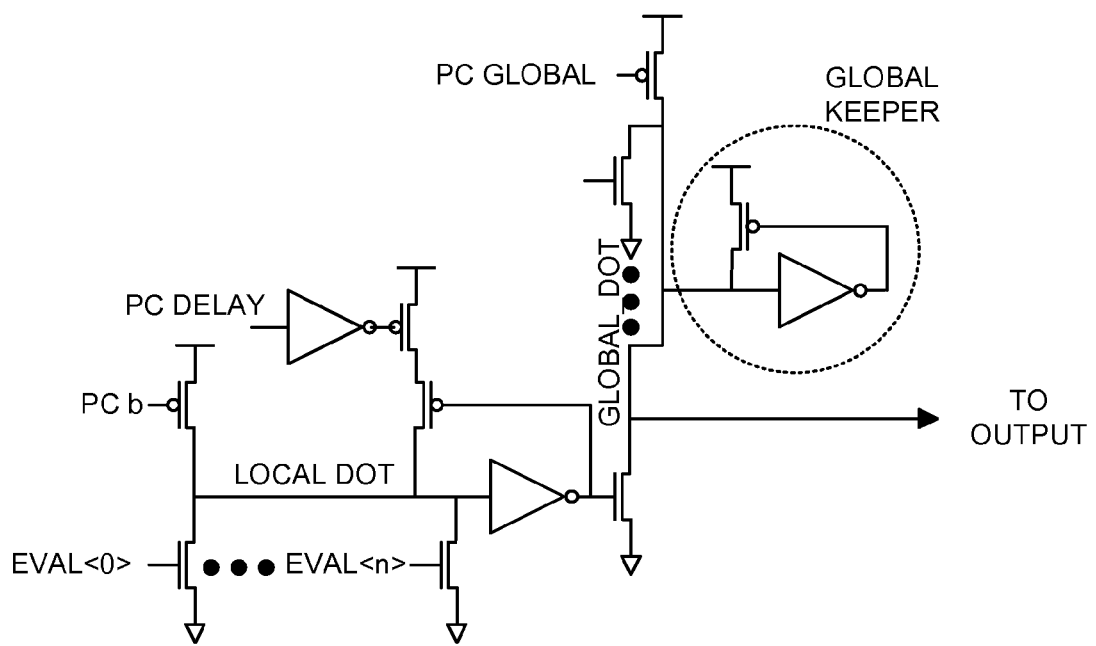
FIGS. 1 and 2 respectively provide a schematic diagram representation illustrating an example prior art dynamic evaluation circuit and waveforms for the prior art dynamic evaluation circuit.
Figure 2:
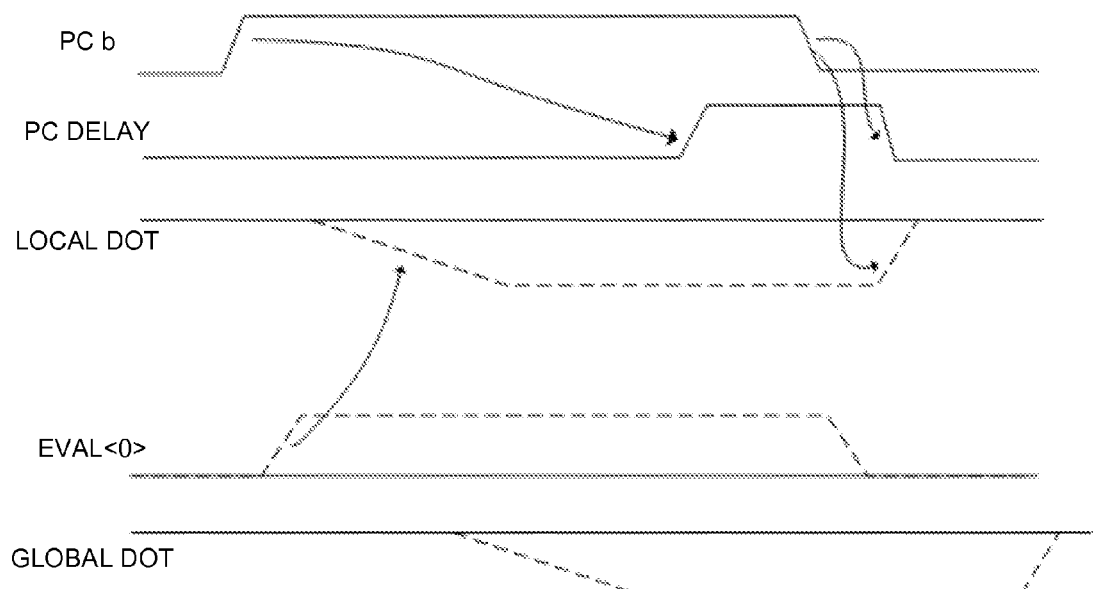

In accordance with features of the invention, circuit 300 implements enhanced performance dynamic evaluation to speedup performance by reducing device load such as shown in FIG. 1, from the sensitive precharge node LOCAL DOT.

Circuit 300 includes control logic generally designated by the reference character 302 provided with a combined precharge and keeper device 304 connected to a precharge node labeled LOCAL DOT. The combined precharge and keeper device 304 is a P-channel field effect transistor (PFET). The dynamic evaluation circuit 300 includes a plurality of evaluation devices 306 implemented by N-channel field effect transistor (NFETs), each receiving a respective evaluation input <0> through <N>, as shown. The PFET combined precharge and keeper device 304 is connected in series with the local evaluation N-channel field effect transistors (NFETs) 306. The series connected PFET combined precharge and keeper device 304 and evaluation NFETs 306 are connected between a voltage supply rail VDD and ground.

The control logic 302 provides a control input labeled PC LOCAL to a gate of the combined precharge and keeper device 304. In accordance with features of the invention, the combined precharge and keeper device responsive to the control input holds the precharge node precharged when the precharge node is not discharged early in an evaluate cycle.

Circuit 300 includes an inverter 310 connecting the precharge node LOCAL DOT to a second global evaluation stage. The control logic 302 includes an inverter 312 connected to the output of the local dot inverter 310, a 2-input AND gate 314, and an OR invert gate or NOR gate 316. The AND gate receives inputs of a set keeper delay signal PC DELAY b and the output of inverter 312, which is connected to the output of local evaluation inverter 310. The AND gate 314 provides a first input to a 2-input NOR gate 316 that receives a precharge signal PC at its second input. The control logic NOR gate 316 provides a control gate input to the combined precharge and keeper device 304.

The second global evaluation stage includes an N-channel field effect transistor (NFET) 320 receiving an input from the local dot line inverter 310 and connected to a global dot node GLOBAL DOT. A global precharge P-channel field effect transistors (PFET) 322 receiving a global precharge input PC GLOBAL is series connected with the NFET 320, which are connected between the voltage supply rail VDD and ground. A global keeper PFET 326 is connected to the global dot node GLOBAL DOT and receiving a gate input of an output of an inverter 328 connected to the global dot node GLOBAL DOT. The global dot node GLOBAL DOT goes to the output of the dynamic evaluation circuit 300.

Figure 4:
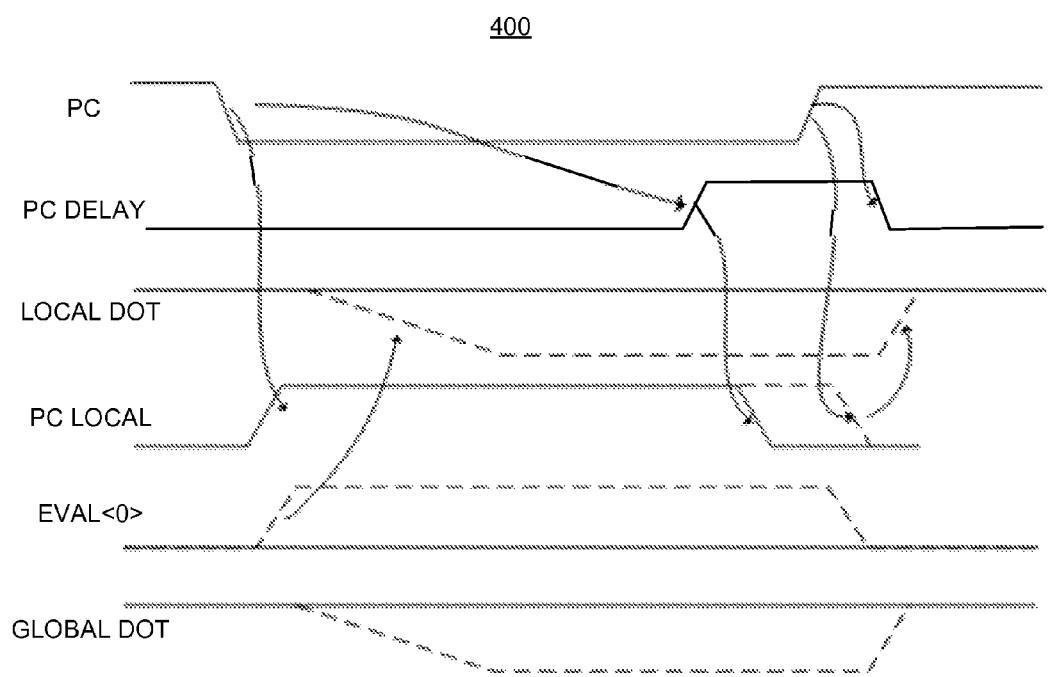
FIG. 4 are waveforms illustrating operation of the example circuit for implementing enhanced performance dynamic evaluation of FIG. 3 in accordance with a preferred embodiment.

Referring also to FIG. 4, there are shown waveforms generally designated by the reference character 400 illustrating operation of the example circuit 300 for implementing enhanced performance dynamic evaluation in accordance with a preferred embodiment. The combined precharge and keeper device 304 receiving input PC LOCAL is turned on only after the precharge node LOCAL DOT would have discharged. If the precharge node LOCAL DOT discharged then the PC LOCAL signal remains high so that the combined precharge and keeper device 304 remains off until the next precharge. If the local dot node did not discharge then the PC LOCAL will turn on the local combined precharge and keeper device 304 corresponding the PC DELAY b input to AND gate 320 providing the low PC LOCAL, thus preventing the precharge node LOCAL DOT from discharging inadvertently due to leakage. The PC LOCAL signal is timed by PC DELAY b such that the slowest possible discharge occurs before the combined precharge and keeper device 304 would turn on and the combined precharge and keeper device 304 turns on before the fastest leakage discharge event could take place responsive to the AND gate output and the PC signal applied to NOR 316.

Figure 5:
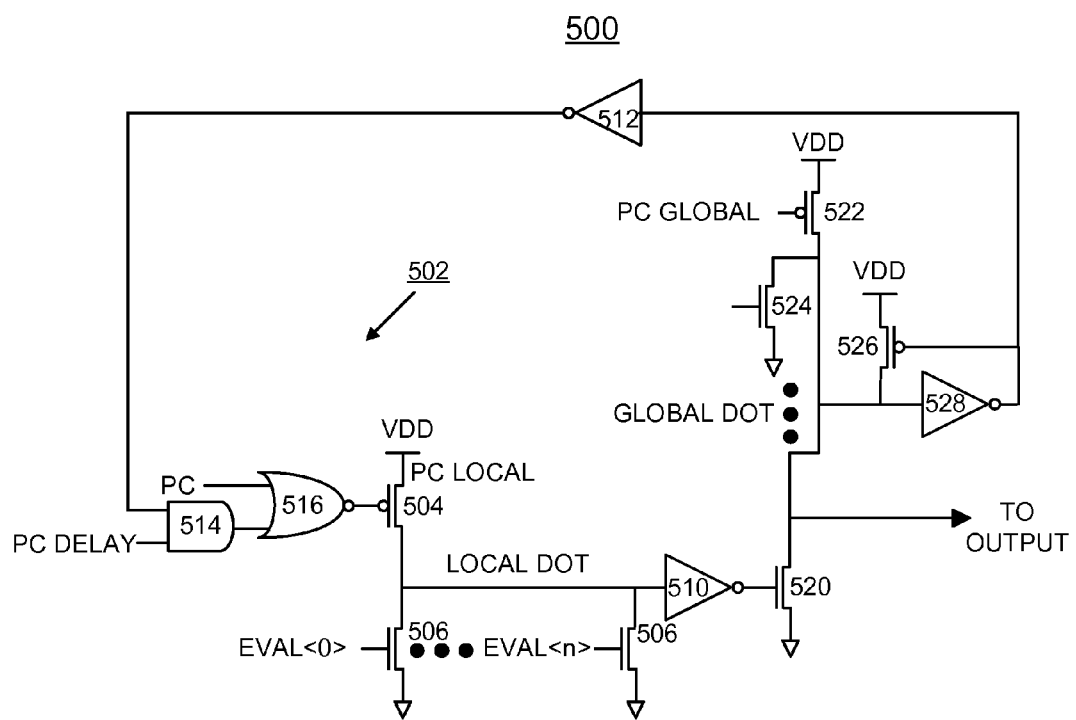
FIG. 5 is a schematic and block diagram representation illustrating another example circuit for implementing enhanced performance dynamic evaluation in accordance with a preferred embodiment.

Referring also to FIG. 5, there is shown another example circuit generally designated by the reference character 500 for implementing enhanced performance dynamic evaluation in accordance with a preferred embodiment. Circuit 500 provides further improvement over prior art circuits improving dynamic evaluation performance.

Circuit 500 includes control logic generally designated by the reference character 502 provided with a combined precharge and keeper device 504 connected to a precharge node labeled LOCAL DOT. The combined precharge and keeper device 504 is a P-channel field effect transistor (PFET). The dynamic evaluation circuit 500 includes a plurality of evaluation devices 506 implemented by N-channel field effect transistor (NFETs), each receiving a respective evaluation input <0> through <N>, as shown. The PFET combined precharge and keeper device 504 is connected in series with the local evaluation N-channel field effect transistors (NFETs) 506. The series connected PFET combined precharge and keeper device 504 and evaluation NFETs 506 are connected between a voltage supply rail VDD and ground.

The control logic 502 provides a control input labeled PC LOCAL to a gate of the combined precharge and keeper device 504. In accordance with features of the invention, the combined precharge and keeper device 504 responsive to the control input holds the precharge node precharged when the precharge node is not discharged early in an evaluate cycle.

Circuit 500 includes an inverter 510 connecting the precharge node LOCAL DOT to a second global evaluation stage. The control logic 502 includes an inverter 512 connected to the output of the second global evaluation stage, a 2-input AND gate 514, and an OR invert gate or NOR gate 516. The AND gate 514 receives inputs of a set keeper delay signal PC DELAY and the output of inverter 512, which is connected to the output of second global evaluation stage. The AND gate 514 provides a first input to a 2-input NOR gate 516 that receives a precharge signal PC at its second input. The control logic NOR gate 516 provides a control gate input to the combined precharge and keeper device 504.

The second global evaluation stage includes an N-channel field effect transistor (NFET) 520 receiving an input from the local dot line inverter 510 and connected to a global dot node GLOBAL DOT. A precharge P-channel field effect transistors (PFET) 522 receiving a global precharge input PC GLOBAL is series connected with the NFET 520 and connected between the voltage supply rail VDD and ground. A global keeper PFET 526 is connected to the global dot node GLOBAL DOT and receiving a gate input of an output of an inverter 528 connected to the global dot node GLOBAL DOT.

The global dot node GLOBAL DOT goes to the output of the dynamic evaluation circuit 500.

Figure 6:
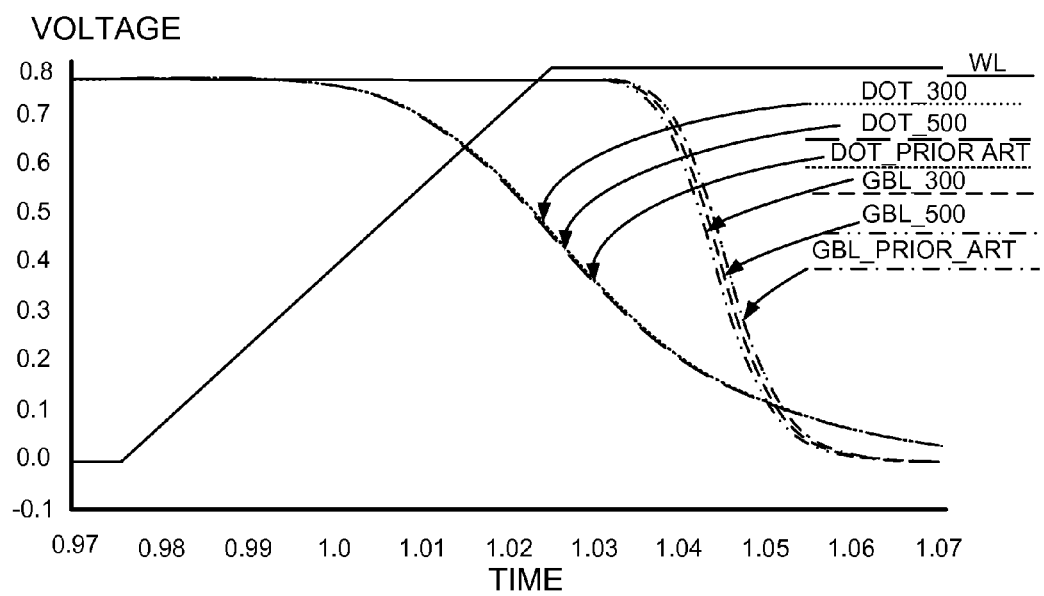
FIG. 6 are waveforms illustrating operation of the example circuit for implementing enhanced performance dynamic evaluation of FIG. 5 in accordance with a preferred embodiment.

Referring also to FIG. 6, there are shown waveforms generally designated by the reference character 600 illustrating operation of the example circuits 300 and 500 in accordance with a preferred embodiment for comparison with the prior art. As shown, the circuit 500 has a smaller delay at the precharge node DOT_500 than the precharge node DOT_300, and the circuit 500 has a smaller delay at the global dot node GLOBAL DOT or GLB_500 than the global dot node GLB_300. Both circuits 300 and 500 provide enhanced performance over the prior art, as shown.

FIG. 7 is chart illustrating example performance delay measurements of the example circuits 300, 500 in accordance with a preferred embodiments in comparison with the prior art. As shown, the prior art delay in picoseconds (ps) between evaluation to global dot is 45.26 ps, where circuit 300 or embodiment #1 has a delay of 44.69 ps for a 1.26% improvement, and circuit 500 or embodiment #2 has a delay of 43.83 ps for a 3.16% improvement.

Figure 8:
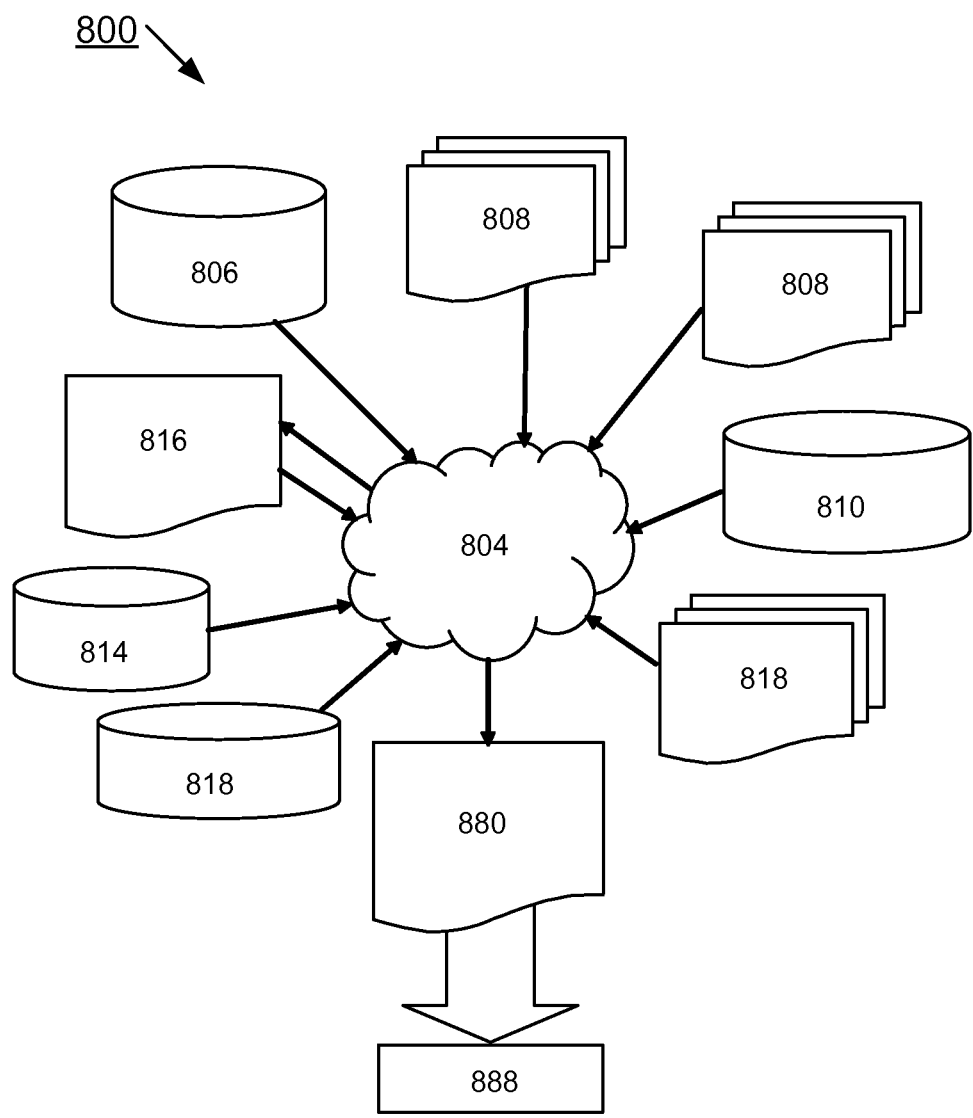
FIG. 8 is a flow diagram of a design process used in semiconductor design, manufacturing, and/or test.

FIG. 8 shows a block diagram of an example design flow 400. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuit 300, and circuit 500 in the form of schematics or HDL, a hardware-description language, for example, Verilog, VHDL, C, and the like. Design structure 802 may be contained on one or more machine readable medium. For example, design structure 802 may be a text file or a graphical representation of circuit 300. Design process 804 preferably synthesizes, or translates, circuit 300 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuit.

Design process 804 may include using a variety of inputs; for example, inputs from library elements 808 which may house a set of commonly used elements, circuits, and devices, including models, layouts, and symbolic representations, for a given manufacturing technology, such as different technology nodes, 22 nm, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIG. 3 and FIG. 5 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 3 and FIG. 5. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing enhanced performance dynamic evaluation, said circuit comprising:
   a combined precharge and keeper device connected to a precharge node;
   control logic coupled to said precharge node providing a control gate input to said combined precharge and keeper device;
   said combined precharge and keeper device holding said precharge node precharged when said precharge node not being discharged in an evaluate cycle.

2. The circuit as recited in claim 1 wherein said combined precharge and keeper device comprises a P-channel field effect transistor (PFET).

3. The circuit as recited in claim 2 wherein said PFET combined precharge and keeper device is connected in series with a local evaluation N-channel field effect transistor (NFET) and the series connected PFET combined precharge and keeper device and evaluation NFET are connected between a voltage supply rail and ground; said evaluation NFET receiving an evaluation gate input.

4. The circuit as recited in claim 1 wherein said precharge node is a local dot node of the dynamic evaluation circuit and further includes an inverter connecting said precharge node to a global evaluation stage.

5. The circuit as recited in claim 4 wherein said control logic includes a 2-input AND gate, said AND gate receives an input of a set keeper delay signal and a second input signal coupled from precharge node; said AND gate providing an output applied to an input to a 2-input NOR gate, and a precharge signal applied to a second input of said NOR gate, said NOR gate providing said control gate input to said combined precharge and keeper device.

6. The circuit as recited in claim 5 wherein said second input signal to said AND gate is coupled from a global dot node of the global evaluation stage of the dynamic evaluation circuit.

7. A design structure embodied in a non-transitory machine readable medium for designing, manufacturing, and testing an integrated circuit in a computer system, the design structure specifying a circuit for implementing enhanced performance dynamic evaluation, said design structure comprising:
   a combined precharge and keeper device connected to a precharge node;
   control logic coupled to said precharge node providing a control gate input to said combined precharge and keeper device;
   said combined precharge and keeper device holding said precharge node precharged when said precharge node not being discharged in an evaluate cycle, wherein the design structure, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure claim 7, wherein the design structure includes at least one of test data files, characterization data, verification data, or design specifications.

11. The design structure of claim 7, wherein said combined precharge and keeper device comprises a P-channel field effect transistor (PFET).

12. The design structure of claim 7, wherein said PFET combined precharge and keeper device is connected in series with a local evaluation N-channel field effect transistor (NFET), and the series connected PFET combined precharge and keeper device and evaluation NFET are connected between a voltage supply rail and ground, said evaluation NFET receiving an evaluation gate input.

13. The design structure of claim 7, wherein said precharge node is a local dot node of the dynamic evaluation circuit and further includes an inverter connecting said precharge node to a global evaluation stage.

14. The design structure of claim 13, wherein said control logic includes a 2-input AND gate, said AND gate receives an input of a set keeper delay signal and a second input signal coupled from precharge node; said AND gate providing an output applied to an input to a 2-input NOR gate, and a precharge signal applied to a second input of said NOR gate, said NOR gate providing said control gate input to said combined precharge and keeper device.

15. The design structure of claim 14, wherein said second input signal to said AND gate is coupled from a global dot node of the global evaluation stage of the dynamic evaluation circuit.

* * * * *